United States Patent [19]

Fazlin

[11] Patent Number: 4,681,649
[45] Date of Patent: Jul. 21, 1987

[54] MULTI-LAYER PRINTED CIRCUIT BOARD VACUUM LAMINATION METHOD

[76] Inventor: Fazal A. Fazlin, 12000 - 28th St., North, St. Petersburg, Fla. 33702

[21] Appl. No.: 723,607

[22] Filed: Apr. 15, 1985

[51] Int. Cl.$^4$ ............................................. B32B 31/20
[52] U.S. Cl. ..................................... 156/285; 156/382
[58] Field of Search ................ 156/104, 285, 286, 382

[56] References Cited

U.S. PATENT DOCUMENTS

| | | | |
|---|---|---|---|
| 1,887,565 | 11/1932 | Sherts | 156/104 |
| 3,681,167 | 8/1972 | Moore | 156/104 X |
| 3,810,815 | 5/1974 | Welhart et al. | 156/104 X |
| 3,818,823 | 6/1974 | Bond | 156/285 X |
| 4,101,364 | 7/1978 | Tsukada et al. | 156/382 X |
| 4,127,436 | 11/1978 | Friel | 156/285 X |
| 4,328,081 | 5/1982 | Fazlin | 204/192 E |
| 4,425,210 | 1/1984 | Fazlin | 204/298 X |
| 4,474,659 | 10/1984 | Fazlin | 204/298 X |

Primary Examiner—Robert A. Dawson
Attorney, Agent, or Firm—Dominik, Stein, Saccocio & Reese

[57] ABSTRACT

A method for laminating the layers of a printed circuit board book composed of printed circuit layers and adhesive layers, the method including loading the book between a pair of platens of a vacuum chamber, moving the platens together to a pre-specified distance apart, and allowing activation and curing of the adhesive layers at a pre-specified temperature and duration.

3 Claims, 3 Drawing Figures

MULTI-LAYER PRINTED CIRCUIT BOARD VACUUM LAMINATION METHOD

BACKGROUND OF THE INVENTION

1. Field of the Invention

This invention relates to the manufacture of multi-layer printed circuit boards. More particularly, this invention relates to methods for laminating the individual printed circuit boards together to produce a multi-layer printed circuit board.

2. Description of the Background Art

Printed circuit boards comprise a sheet or board of electrically resistive material on which is printed a wiring circuit. Various electrical components such as integrated circuits, discrete components and connectors are then soldered to the wiring circuit via holes drilled through the board. Double-sided printed circuit boards comprise a board having a wiring circuit printed on both sides thereof.

Multi-layer printed circuit boards have been developed which comprise individual single- or double-sided printed circuit boards laminated together. The result obtained is a multi-layered board having outer and inner layers of printed circuits electrically insulated from one another. Holes are drilled through the board at planned locations to allow interconnection of one printed circuit with one or more of the printed circuits. Drill smear existing on the edges of the hole of the printed circuit is removed either through a wet etch-back process or by the plasma desmearing process disclosed in my previous patent, U.S. Pat. No. 4,425,210, entitled "Plasma Desmearing Apparatus and Method", the disclosure of which is hereby incorporated by reference herein.

After drill smear is removed, the holes are then plated through to electrically interconnect the individual printed circuits by either electrolytic plating, electroless plating, immersion plating, or plasma plating, as more particularly disclosed in my previous patent, U.S. Pat. No. 4,474,659, entitled "Plated-Through-Hole Apparatus and Method", the disclosure of which is hereby incorporated by reference herein. The multi-layer board is now ready to receive the various electrical components via the holes in the board. After inserting the leads of the components into the holes, the components are soldered to the printed circuits, either individually or by wave soldering techniques.

From the foregoing brief description, it is evident that the manufacturer of multi-layer printed circuit boards (MPCB) involves many exacting processes in order to produce a structurally and electrically sound MPCB which meets with military and civilian specifications. In regard to my present invention, as set forth hereinafter in more detail, one of the many problems associated with the manufacture of MPCBs is the method for laminating the printed circuit boards to meet such specifications. Usually, failure of the MPCB is the result of improper or inadequate lamination of the layers together which results in, in some areas, no secure lamination during the manufacturing process or actual delamination in the field when the board is in use. Consequently, proper lamination is critical to the successful manufacture of MPCBs.

Presently, there exist many variations in the techniques used to successfully laminate MPCBs. One of the most common techniques for producing MPCBs is to begin with non-conductive boards which are coated on both sides with copper or similar conductive material. Each side of the double-sided board is then coated with an etch-resistant/photo-resist material. Using a photographic negative of the desired printed circuit, the photo-resist is exposed and developed to remove the photo-resist in all areas except for the lines which will constitute the printed circuit. The board is then etched to remove the copper coating in all areas except for such lines, thereby producing copper lines defining the printed circuit. Of course, the printed circuits formed on each side of the double-sided board have been registered with respect to one another. Usually, through registration holes are provided to assure that the printed circuits will be registered when the boards are laminated together.

During the actual step of lamination, the boards are stacked on a platen. An epoxy-impregnated, non-conductive woven material, also known as "B" stage, is placed between each adjacent board and then another platen is placed on top of the sandwiched lamination. The woven material is selected having a certain thickness to assure that the printed circuit on one board is electrically isolated from that of the adjacent board. The bottom platen usually includes registration pins which allow the boards to be registered with respect to one another, thereby also registering the printed circuits.

The sandwiched platens/printed circuit boards/epoxy-impregnated woven material, commonly referred to as a "book", is placed into a heated, hydraulic press. The press is then operated to heat and forcibly compress the book to activate and rapidly cure the epoxy contained within the woven material. After curing the epoxy at the desired temperature and pressure, the book is released from the press and, after cooling, the platens are removed revealing the produced MPCB. After drilling the MPCB, the holes in the MPCB are desmeared and then plated-through by one of the processes discussed above. The MPCB is now ready for receiving the electrical components.

In other variations of the lamination method, the book may comprise inner layers composed of single-sided boards, and/or the adhesive layer may comprise epoxy-glass, acrylic, or the products sold under the trademarks "Polyamide", "Kapton", or "Teflon".

One of the most difficult problems associated with the laminating process is the difficulty of properly heating and compressing the layers of boards and epoxy-impregnated woven material together with assurance that the epoxy will be heated to sufficiently flow and make adhesive contact with all areas of the boards as pressure is simultaneously applied. Specifically, underheating and/or underpressurization may result in some areas never being properly bonded. Conversely, overheating and/or overpressurization will, typically, result in too much of the epoxy being forced out from between the boards and/or over-compression of the woven material. This will produce a thinner, non-conductive layer which does not electrically isolate the printed circuit on one board from that of the adjacent board. Consequently, the desired electrical properties of non-conductance between printed circuits cannot be assured. Further, so much epoxy may have been forced out from between the boards that delamination in the field will occur due to the lack of optimal bonding strength.

Therefore, it is an object of this invention to provide a method which overcomes the aforementioned inadequacies of the prior art and provides an improvement which is a significant contribution to the advancement of multi-layer printed circuit board lamination art.

Another object of this invention is to provide a multi-layer printed circuit board lamination method which provides for more precise and consistent lamination of printed circuit boards than that which can be obtained by previously known methods.

Another object of this invention is to provide a multi-layer printed circuit board lamination method which involves the use of a vacuum chamber to assure that the heating and bonding of the epoxy occurs in a vacuum.

Another object of this invention is to provide a multi-layer printed circuit board lamination method in which the lamination is carried out in a vacuum and with no substantial pressure being applied to the printed circuit board to assure proper thickness and bonding of the epoxy during the process.

Another object of this invention is to provide a multi-layer printed circuit board lamination method which can be accomplished with repeatable accuracy to assure production of multi-layer printed circuit boards in production quantities and meeting the highest specifications.

The foregoing has outlined some of the more pertinent objects of the invention. These objects should be construed to be merely illustrative of some of the more prominent features and applications of the intended invention. Many other beneficial results can be attained by applying the disclosed method in a different manner or modifying the method within the scope of the disclosure. Accordingly, other objects and a fuller understanding of the invention may be had by referring to the summary of the method and the detailed description of the preferred method in addition to the scope of the invention defined by the claims taken in conjunction with the accompanying drawings.

SUMMARY OF THE INVENTION

The invention is defined by the appended claims with a specific embodiment shown in the attached drawings. For the purpose of summarizing the invention, the invention comprises a unique lamination method for producing multi-layer printed circuit boards. Basically, the method of the invention comprises positioning layers of double- or single-sided printed circuit boards and B stage (or other adhesive layer) between a pair of platens to form a book, as that term is conventionally used in the printed circuits industry. The book is then placed between a pair of chamber platens within a vacuum chamber. One or both of the chamber platens are operatively connected to a motive means so as to move toward one another to tighten about the book. A position sensor, either opto-electrical or electro-mechanical, is provided to sense the relative spacing between the two chamber platens. The chamber platens are heated by one or more possible heat sources. All of these functions may either be under manual control or controlled by a state-of-the-art computer.

The steps of the method of the invention comprise, first, forming a book of printed circuit boards and layers, as is conventional in the art, and then placing the book between the chamber platens of the vacuum chamber. The lid of the vacuum chamber is closed and the vacuum pump is operated to evacuate the vacuum chamber. Heat is applied to the chamber platens by one of many possible heat sources and the motive means is operated to move the chamber platens together to a prespecified distance apart from one another, depending on the overall thickness of the book. The position sensor determines the relative positions of the chamber platens. When the chamber platens have been moved to the prespecified distance apart, the chamber platens are held at that position while heat is applied to the layers. After a prespecified time period sufficient to melt and cure the epoxy contained within the B stage (or other adhesive layer) the chamber platens are moved apart as atmospheric pressure is restored within the chamber. The book is removed revealing the newly laminated multi-layer printed circuit board. The process may then be repeated.

One of the most important features of the subject method of the invention is that the lamination is accomplished within a vacuum. In such a vacuum, the great majority of the air which is naturally present between the individual layers of the book is evacuated before the epoxy is activated by the heat. Consequently, all areas of the layers of the book intimately contact one another because of the non-existence of trapped air between such layers. Thus, during activation and curing of the epoxy, a complete bond is assured to be attained between the material and the boards on all surfaces. The weak spots sometimes found in previous lamination methods are, therefore, precluded.

Another significant feature of the method of the invention is the lack of excessive pressure being exerted on the book which would otherwise force out significant amounts of epoxy during the lamination process. More specifically, the method of the invention comprises moving the chamber platens together to a predetermined distance apart from one another, dependent upon the thickness of the book to be laminated. Because of the lack of air between the layers, intimate contact can be assured between the layers of the book when the platens are simply moved to the predetermined, spaced-apart distance. Notably, it becomes unnecessary to continually apply significant pressure on the layers which, as noted earlier, could result in forcing too much epoxy from the between the boards such that insufficient bonding is present which will result in delamination in the field.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other methods for carrying out the same purposes of the present invention. It should also be realized by those skilled in the art that such equivalent methods do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
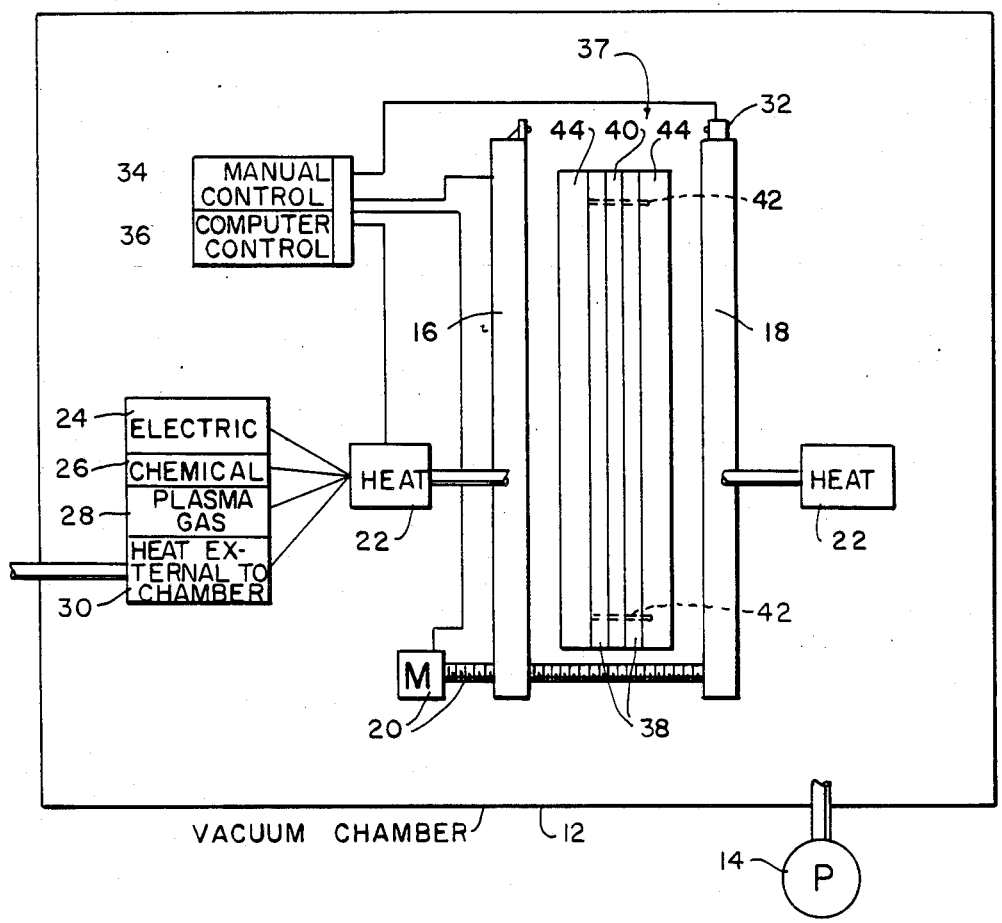
FIG. 1 is a diagrammatical view showing the electrical and mechanical components necessary to accomplish the preferred method of the invention.

FIG. 1 illustrates some of the electrical and mechanical components necessary to accomplish the method of the invention. Basically, the method of the invention is conducted within a vacuum chamber 12 of practically any desired shape or configuration and possibly that disclosed in my previous patents referenced above. A vacuum pump 14 is provided with appropriate valving to evacuate the chamber. Inside the chamber, two chamber platens 16 and 18 are provided, one or both of which is movable with respect to the other by suitable motive means generally indicated by the numeral 20. Both of the chamber platens 16 and 18 are heated by a suitable heat source generally indicated by numeral 22. Without limitation, the heat source 22 may include electrical heating such as resistive elements 24, chemical heating 26, heat produced upon the formation of plasma gas 28 (see my previous patents referenced above) or an external heat source 30 fluidly connected to a heat exchanger incorporated within the chamber platens 16 and 18. The relative spacing of the chamber platens 16 and 18 is constantly monitored by means of a position sensor 32 which may be an electro-optical device or an electro-mechanical device without departing from the spirit and scope of this invention. All of the components may be operated under manual control 34 or by computer control 36.

Figure 2:
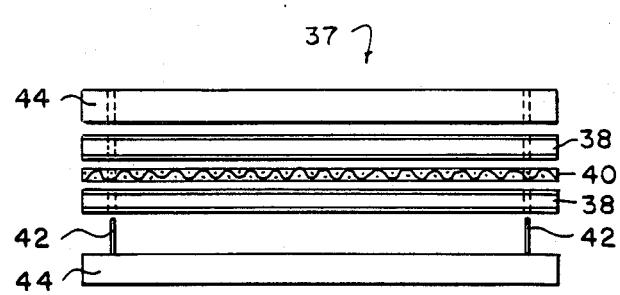
FIG. 2 is a diagrammatical view showing a conventional book composed of double-sided printed circuit boards to be laminated together by means of B stage or other adhesive layers.

FIG. 2 is a diagrammatical view showing a conventional book composed of double-sided printed circuit boards to be laminated together by means of B stage or other adhesive layers. More specifically, conventional books 37 comprised double- or single-sided boards 38 (or layers) which are separated from one another by means of the B stage 40 (or other adhesive layers). The B stage and the other adhesive may comprise any of the presently available materials used in the industry without departing from the spirit and scope of this invention. Moreover, the term "adhesive layer" shall be defined to include all of such materials for the purposes of the claims appended hereto. These layers are placed between a pair of book platens 44 and are registered with respect to one another by means of registration pins 42.

Figure 3:
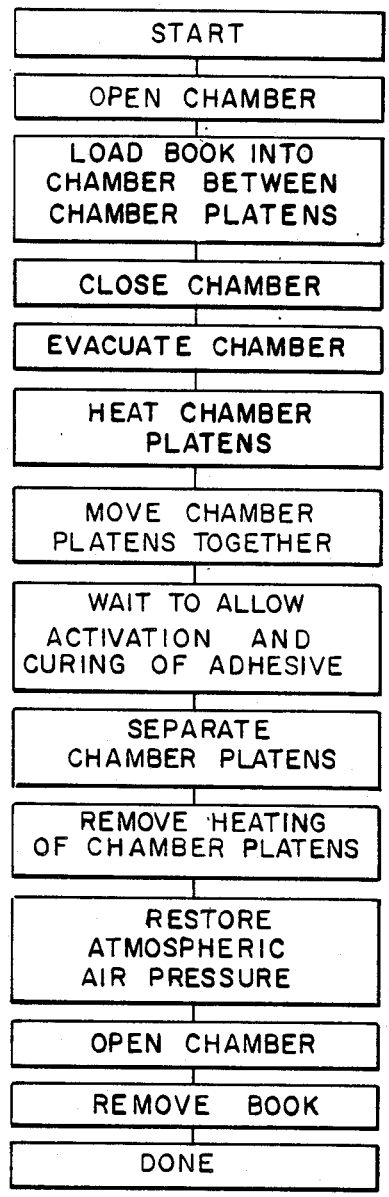
FIG. 3 is a labeled flow chart illustrating the steps of the preferred method of the invention.

Referring to FIG. 3, the method 10 of the invention comprises the steps listed in the flow chart. More particularly, with reference also to FIG. 1, the method of the invention comprises the steps of opening the chamber 12 and then loading the book 37 between the pair of chamber platens 16 and 18.

Once the book 37 is properly loaded into the chamber 12, the lid (not shown) of the chamber 12 is closed and the chamber 12 is evacuated by means of pump 14. The chamber platens 16 and 18 are heated by means of heat source 22 until a desired temperature is attained. In this regard, temperature sensors 46 are provided to accurately sense the actually temperature of the chamber platens 16 and 18. Before, during or after the heating of the chamber platens 16 and 18, the chamber platens 16 and 18 are moved together by motive means 20 until they are a prespecified distance apart. Position sensor 32 is provided to accurately determine such prespecified distance and to feedback such information to computer 36 or to the operator if operated under manual control 34. The prespecified distance is determined according to the thickness of the book 37.

After activation and curing of the epoxy contained within the epoxy-impregnated material (or other adhesive material) being used), the chamber platens 16 and 18 are separated by motive means 20. The supply of heat 22 to the chamber platens 16 and 18 is discontinued, and chamber 12 is returned to atmospheric pressure. The chamber 12 is opened and the newly laminated multi-layer printed circuit board is removed. The process is then repeated to produce another laminated multi-layer printed circuit board.

It is noted that, without departing from the spirit and scope of this invention, many MPCBs can be produced at the same time within the chamber by actually producing two or more MPCBs between the pair of chamber platens 16 and 18, by providing additional pairs of platens, and/or by ganging the platens such that one or more MPCBs are produced between adjacent platens.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of steps and the combination and sequence of steps may be resorted to without departing from the spirit of the invention.

Now that the invention has been described, what is claimed is:

1. A method for laminating the layers of a book composed of printed circuit layers and adhesive layers comprising the steps of:

providing a vacuum chamber including a pair of spaced apart chamber platens;

loading the book between the pair of chamber platens within the chamber;

closing the chamber;

evacuating the chamber;

moving the chamber platens together to a prespecified distance apart;

allowing activation and curing of the adhesive of the adhesive layer including the application of heat to the chamber platens at a prespecified temperature and duration by creating a plasma gas inside the chamber to cause such activation and curing of said adhesive;

separating the chamber platens;

restoring the vacuum chamber to atmospheric pressure;

opening the chamber; and removing the book from the chamber.

2. The method as set forth in claim 1, wherein the step of creating a plasma gas inside the chamber comprises the step of incorporating a power electrode within the chamber and connecting a power source to the power electrode and to the chamber platens to create plasma gas and heat between the power electrode and the chamber platens thereby heating the layers of the book.

3. A method for laminating the layers of a book composed of printed circuit layers and adhesive layers comprising the steps of:

providing a vacuum chamber including a pair of spaced apart chamber platens;

loading the book between the pair of chamber platens within the chamber;
closing the chamber;
evacuating the chamber;
moving the chamber platens together to a prespecified distance apart;
allowing activation and curing of the adhesive of the adhesive layer including the application of heat to the chamber platens at a prespecified temperature and during by providing a chemical heat source to cause such activation and curing of said adhesive;
separating the chamber platens;
restoring the vacuum chamber to atmospheric pressure;
opening the chamber; and
removing the book from the chamber.

* * * * *

UNITED STATES PATENT AND TRADEMARK OFFICE
CERTIFICATE OF CORRECTION

PATENT NO. : 4,681,649

DATED : July 21, 1987

INVENTOR(S) : Fazal A. Fazlin

It is certified that error appears in the above-identified patent and that said Letters Patent is hereby corrected as shown below:

In Column 8, at line 1, please delete "during" and insert therefor --duration--.

Signed and Sealed this

Twelfth Day of July, 1988

Attest:

DONALD J. QUIGG

*Attesting Officer*    *Commissioner of Patents and Trademarks*